(12) United States Patent
Ke

(10) Patent No.: US 6,356,852 B1
(45) Date of Patent: Mar. 12, 2002

(54) MULTI-PORT PROGRAMMABLE TESTER

(75) Inventor: Meng-Kun Ke, Pine Brook, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/368,029

(22) Filed: Aug. 3, 1999

(51) Int. Cl.[7] .............................................. G01R 31/04

(52) U.S. Cl. ...................... 702/117; 324/500

(58) Field of Search ............................... 702/117, 108, 702/1, 85, 127; 324/500; 455/418, 420, 500, 67.1, 67.4, 78, 560; 375/216, 218, 241, 242, 245, 250, 251

(56) References Cited

U.S. PATENT DOCUMENTS

| | | | | |
|---|---|---|---|---|
| 5,434,981 A | * | 7/1995 | Lenihan et al. | ............. 709/100 |
| 5,784,299 A | * | 7/1998 | Evers et al. | ................... 702/85 |
| 6,081,125 A | * | 6/2000 | Krekels et al. | ............. 324/601 |
| 6,157,183 A | * | 12/2000 | Bradley | ................... 324/76.23 |

* cited by examiner

Primary Examiner—Marc S. Hoff
Assistant Examiner—Edward Raymond
(74) Attorney, Agent, or Firm—Baker & McKenzie

(57) ABSTRACT

A multi-port programmable analog tester for testing an analog device having more than two test ports includes a two-port network analyzer having two network analyzer ports and an interface device coupled to the network analyzer. The interface device has at least two levels of switches, and is adapted to be coupled to the test ports of the analog device.

19 Claims, 4 Drawing Sheets

MULTI-PORT PROGRAMMABLE TESTER

FIELD OF THE INVENTION

The present invention is directed to analog devices. More particularly, the present invention is directed to the testing of multi-port analog devices.

BACKGROUND OF THE INVENTION

Analog devices such as radio frequency ("RF") or microwave switching networks, multi-port power combiners/dividers and multi-port subsystems, must be tested before they are implemented. In the communication field, many of the analog devices are either radio frequency or microwave devices. These devices typically have multiple ports, and it is desirable to test the operating characteristics of each port individually, and among various combinations of ports.

A commonly used tool to test the ports of analog devices is a network analyzer. One example of a network analyzer is the HP 8753D Network Analyzer from Hewlett-Packard Corp. Most, if not all known network analyzers are two-port measurement instruments. In other words, these known network analyzers can only measure two ports of an analog device at a time.

This limitation can cause assorted problems when testing analog devices that include more than two ports. For one, while two of the ports are being tested, the other ports must be terminated using, for example, a 50 ohm or 75 ohm terminator. Further, after two ports are tested, the test cables that couple the network analyzer to the analog device must be physically moved or rewired to two additional ports, which can be time-consuming and difficult. This task can be even more time-consuming and difficult if the tested device is in a hard to reach location such as a test oven.

Based on the foregoing, there is a need for a device that can more easily test multi-port analog devices.

SUMMARY OF THE INVENTION

One embodiment of the present invention is a multi-port programmable analog tester for testing an analog device having more than two test ports. The tester includes a two-port network analyzer having two network analyzer ports and an interface device coupled to the network analyzer. The interface device has at least two levels of switches, and is adapted to be coupled to the test ports of the analog device.

DETAILED DESCRIPTION

One embodiment of the present invention is a multi-port programmable tester that includes an interface device that couples a two-port network analyzer to a multi-port analog device under test. The interface device allows the network analyzer to test more than two ports of the device without rewiring the connection between the network analyzer and the device.

Figure 1:
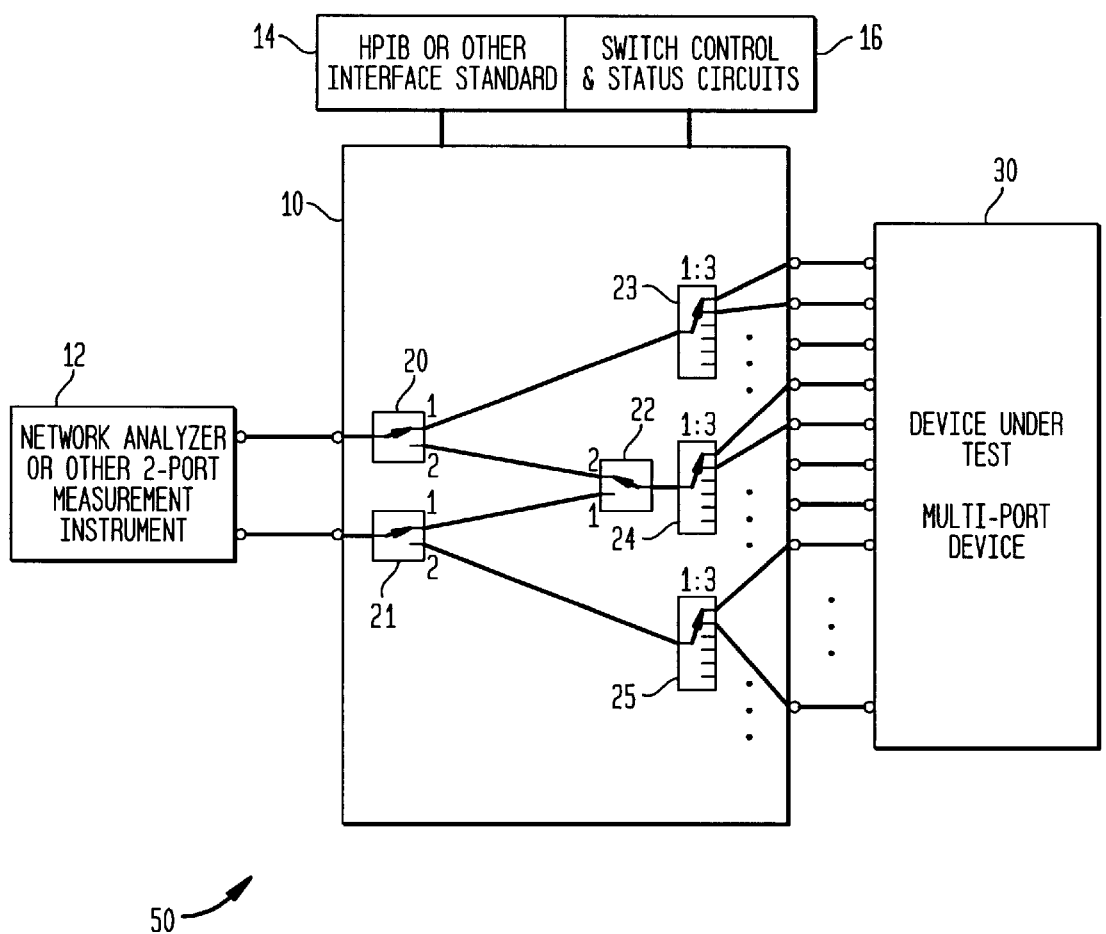
FIG. 1 is a block diagram of a multi-port programmable tester in accordance with one embodiment of the present invention.

Referring now to the drawings, wherein like reference numerals indicate like elements, FIG. 1 is a block diagram of a multi-port programmable tester 50 in accordance with one embodiment of the present invention. Tester 50 includes a network analyzer 12 or other two-port measurement instrument. In one embodiment, network analyzer 12 is the HP 8753D Network Analyzer from Hewlett-Packard Corp.

Network analyzer 12 is coupled to an interface device 10 through its two ports. Interface device 10 includes multiple RF switches 20–25 that couple network analyzer 12 to a multi-port device 30 that is being tested. Switches 20–25 form three levels of switches.

Switches 20 and 21 each have one input and two outputs (abbreviated as "1:2", where the first number is the number of inputs and the second number is the number of outputs). The inputs of switches 20 and 21 are directly coupled to the ports of network analyzer 12. Switches 20 and 21 form a first level of switches.

Switch 22 is a 2:1 switch having the two inputs coupled to outputs of switches 20 and 21, respectively. Switch 21 forms a second level of switches.

Switches 23–25 are 1:6 switches having the inputs coupled to switches 20, 22 and 21, respectively. Switches 23–25 form a third level of switches. Each of switches 23–25 form a group, and each output of switches 23–25 may be coupled to one of the ports of device 30. If device 30 has 18 ports, each output of switches 23–25 is coupled to a single port. If device 30 has less than 18 ports, some of the outputs of switches 23–25 are not coupled to device 30. In one embodiment, switches 23–25 are RF switches in which any unconnected output is automatically terminated, or grounded.

In the embodiment shown in FIG. 1, two ports may be tested at one time, but the two ports being tested must be between groups of switches 23–25. For example, two ports that are both coupled to switch 23 cannot be tested at once, while one port coupled to switch 23 and one port coupled to switch 25 can be tested at once.

Switch control and status circuits 16 are coupled to interface device 10. Switch control and status circuits 16 allow switches 20–25 to be computer controlled, and display the status of switches 20–25. A Hewlett-Packard Interface Bus ("HPIB") or other interface standard 14 allows a computer to be coupled to interface device 10 and switch control and status circuits 16.

Figure 2:
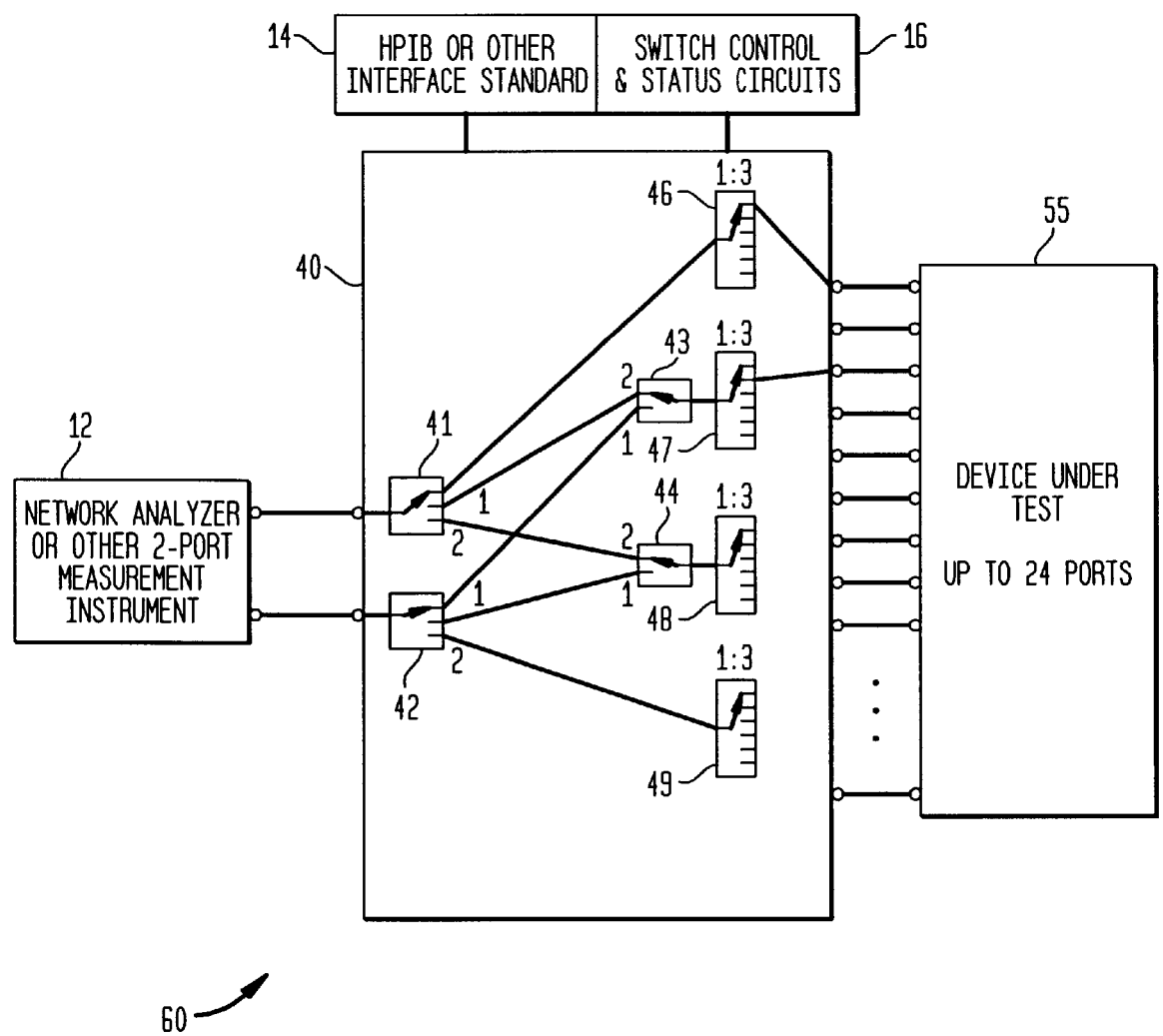
FIG. 2 is a block diagram of a multi-port programmable tester in accordance with a further embodiment of the present invention.

FIG. 2 is a block diagram of a multi-port programmable tester 60 in accordance with a further embodiment of the present invention. Like tester 50 in FIG. 1, tester 60 includes network analyzer 12, switch control and status circuits 16, and HPIB or other interface standard 14. Tester 60 can test a multi-port device 55 having up to 24 ports.

Interface 40 of tester 60 includes three levels of switches. The first level includes 1:3 switches 41 and 42. The second level includes 2:1 switches 43 and 44. The third level includes 1:6 switches 46–49.

Switches 41–44 and 46–49 are coupled in a similar arrangement as switches 20–25 of FIG. 1. Specifically, the inputs of first level switches 41 and 42 are coupled to network analyzer 12. The outputs of first level switches 41 and 42 are coupled to both second level switches 43 and 44 and third level switches 46 and 49. The output of second level switches 43 and 44 are coupled to third level switches 47 and 48 that are not coupled to any first level switches. Finally, the outputs of third level switches 46–49 are coupled to multi-port device 55.

As in tester 50 of FIG. 1, each third level switch 46–49 forms a group, and the two ports under test at any one time must be between the groups.

By expanding the number of second level and third level switches and/or the capacity of such switches, additional embodiments of the present invention similar to those shown in FIGS. 1 and 2 are available that can accommodate larger (i.e., more ports) multi-port devices. In general, the configuration of all of these three-level switch embodiments, including those shown in FIGS. 1 and 2, can be defined in terms of "N" groups of "M" ports, where N and M are the number of groups and ports, respectively. Thus, for example, with interface device 10 of FIG. 1, N equals 3 and M equals 6. In terms of N and M, the devices can be defined as follows:

a. the first level of switches include two 1:(N−1) switches;
b. the second level of switches include (N−2) number of 2:1 switches; and
c. the third level of switches include N number of 1:M switches.

Figure 3:
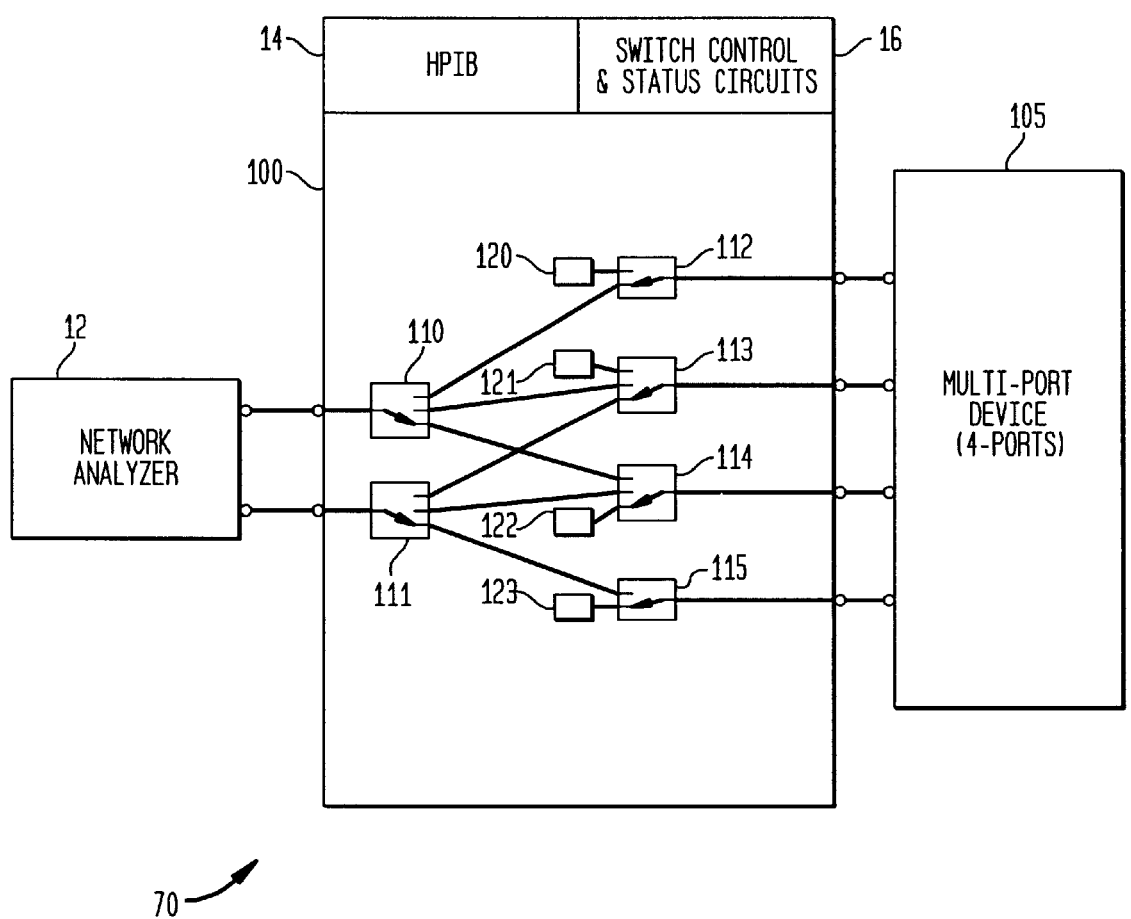
FIG. 3 is a block diagram of a multi-port programmable tester in accordance with a further embodiment of the present invention.

FIG. 3 is a block diagram of a multi-port programmable tester 70 in accordance with a further embodiment of the present invention. Tester 70 is configured to test a 4-port device 105. Tester 70 includes an interface device 100 that has two levels of switches 110–115 in contrast to the three levels of switches in testers 50 and 60 of FIGS. 1 and 2, respectively.

Switches 110 and 111 are 1:3 switches having inputs coupled to network analyzer 12, and outputs coupled to different second level switches 112–115. Second level switches 112–115 are either 2:1 or 3:1 switches having their output coupled to a single port of 4-port multi-port device 105. Each second level switch 112–115 has an input that is coupled to a terminator 120–123. Tester 70, unlike switches 50 and 60, allows any combination of two ports of device 105 to be tested at once.

Figure 4:
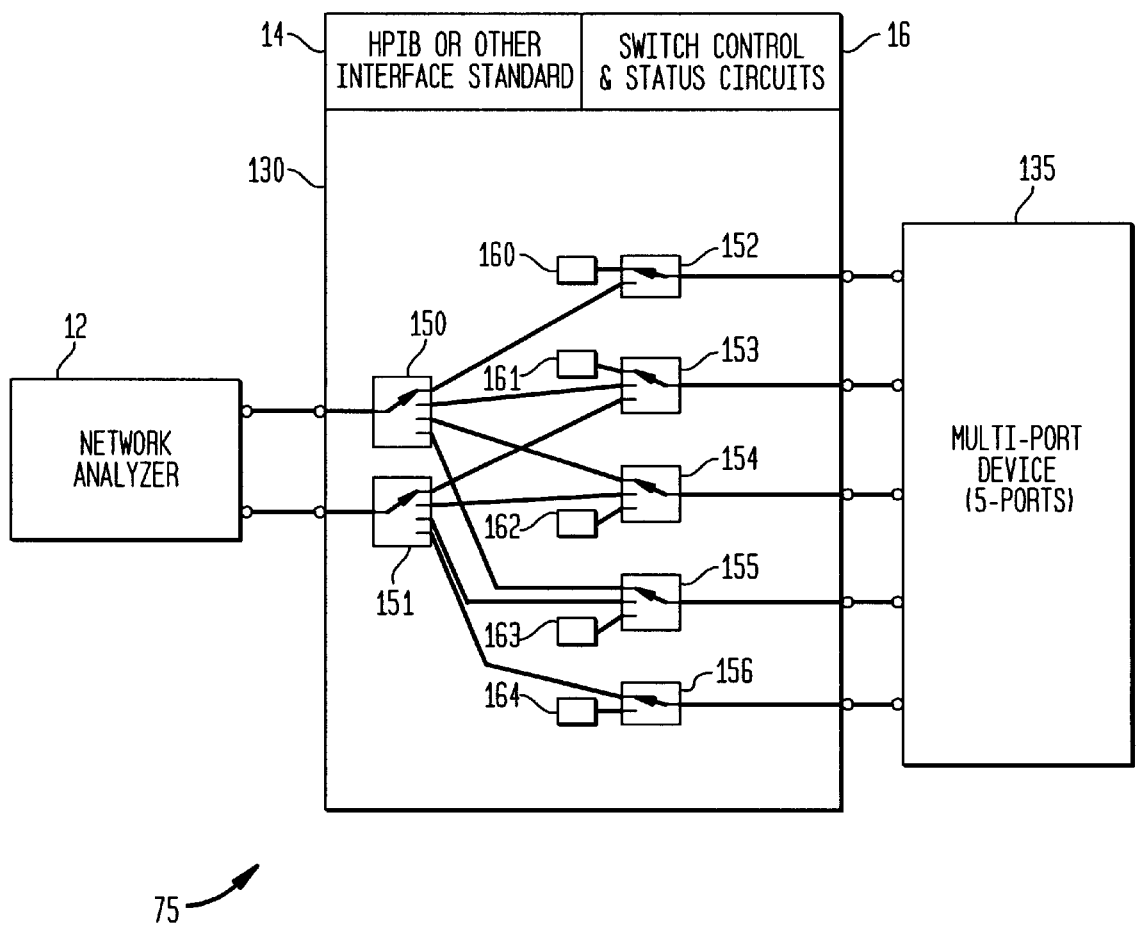
FIG. 4 is a block diagram of a multi-port programmable tester in accordance with a further embodiment of the present invention.

FIG. 4 is a block diagram of a multi-port programmable tester 75 in accordance with a further embodiment of the present invention. Tester 75 is configured to test a 5-port device 135.

Interface device 130 of tester 75 includes first level 1:4 switches 150 and 151 coupled to second level switches 152–156. Second level switches 152–156 are either 2:1 or 3:1 switches. Terminators 160–164 are coupled to the unused inputs of switches 152–156.

Other embodiments of interface devices 100 and 130 in accordance with the present invention include additional second level switches in order to accommodate larger (i.e., more ports) multi-port devices. In general, the configuration of all of these two-level switch embodiments, including those shown in FIGS. 3 and 4, can be defined in terms of "N" ports, where N is the number of ports. Thus, for example, with interface device 100 of FIG. 3, N equals 4. In terms of N, the devices can be defined as follows:

a. the first level of switches include two 1:(N−1) switches;
b. the second level of switches include:
  i. (N−2) number of 3:1 switches;
  ii. two 2:1 switches; and
  iii. N terminators.

Most typical RF switches have a limited number of ports that they can accommodate depending on the switching frequency. Therefore, in some cases, if M or N in the above-described embodiments is sufficiently large, then one level of switches may have to be expanded into two levels of switches. For example, instead of having a level of switches that includes 1:12 switches, if 12 is too large a number, each 1:12 switch can be converted into two 1:6 switches coupled to a 1:2 switch in a known manner.

As described, the present invention allows the testing of more than two ports of an analog device without rewiring the connection between a network analyzer and the device. The testing is therefore easier and less time-consuming.

Several embodiments of the present invention are specifically illustrated and/or described herein. However, it will be appreciated that modifications and variations of the present invention are covered by the above teachings and within the purview of the appended claims without departing from the spirit and intended scope of the invention.

For example, the switching function implemented by the interface devices can be performed using silicon "switches", or any other type of device that switches inputs to outputs. Further, although in the embodiments shown the interface device is coupled to a two-port network analyzer, a network analyzer with more than two-ports can be used in some embodiments of the present invention.

What is claimed is:

1. A multi-port programmable analog tester for testing an analog device having more than two test ports, said tester comprising:
   a two-port network analyzer having two network analyzer ports; and
   an interface device coupled to said network analyzer;
   wherein said interface device has at least two levels of switches, and is adapted to be coupled to more than two test ports of the analog device.

2. The analog tester of claim 1, wherein said interface device comprises:
   a first level of switches, each first level switch having a first input coupled to one of said two network analyzer ports and having a plurality of first outputs;
   a second level of switches having second inputs coupled to said first level of switches; and
   a third level of switches, each third level switch having a third input and having third outputs coupled to at least one of the more than two test ports, wherein said third input is coupled to said first level of switches or said second level of switches.

3. The analog tester of claim 2, wherein said first level of switches comprises two first level switches, said second level of switches comprises one second level switch, and said third level of switches comprises three third level switches.

4. The analog tester of claim 2, wherein said first level of switches comprises two first level switches, said second level of switches comprises two second level switch, and said third level of switches comprises four third level switches.

5. The analog tester of claim 2, wherein said first level of switches comprises at least one 1:3 switch, said second level of switches comprises at least one 2:1 switch, and said third level of switches comprises at least one 1:6 switch.

6. The analog tester of claim 1, wherein said interface device comprises:
   a first level of switches, each first level switch having a first input coupled to one of said two network analyzer ports, and having a plurality of first outputs;
   a plurality of terminators; and
   a second level of switches, each second level switch having a plurality of second inputs and a second output coupled to one of the more than two test ports, wherein at least one of said second inputs is coupled to said first level of switches, and at least one of said second inputs is coupled to one of said terminators.

7. The analog tester of claim 6, wherein said first level of switches comprises a plurality of 1:3 switches and said second level of switches comprises a plurality of 2:1 switches and 3:1 switches.

8. The analog tester of claim 6, wherein said first level of switches comprises a plurality of 1:4 switches and said second level of switches comprises a plurality of 2:1 switches and 3:1 switches.

9. The analog tester of claim 1, further comprising:
switch control and status circuits coupled to said interface device; and
a computer interface coupled to said interface device.

10. The analog tester of claim 2, said third level of switches comprising N groups of switches, each group having M output ports, wherein:
said first level of switches comprises two 1:(N−1) switches;
said second level of switches comprises (N−2) number of 2:1 switches; and
said third level of switches comprises N number of 1:M switches.

11. The analog tester of claim 6, said second level of switches comprising N output ports, wherein:
said first level of switches comprises two 1:(N−1) switches; and
said second level of switches comprises:
(N−2) number of 3:1 switches;
two 2:1 switches; and
N terminators.

12. An interface device for coupling a two-port network analyzer having two network analyzer ports to an analog device comprising:
at least two levels of switches, wherein one of said two levels is adapted to be coupled to the two network analyzer ports and another of said two levels is adapted to be coupled to more than two test ports of the analog device.

13. The interface device of claim 12, wherein said at least two levels of switches comprise:
a first level of switches, each first level switch having a first input coupled to one of said two network analyzer ports and having a plurality of first outputs;
a second level of switches, each second level switch having second inputs coupled to said first level of switches; and
a third level of switches, each third level switch having a third input and having third outputs coupled to at least one of the more than two test ports, wherein said third input is coupled to said first level of switches or said second level of switches.

14. The interface device of claim 13, wherein said first level of switches comprises two first level switches, said second level of switches comprises one second level switch, and said third level of switches comprises three third level switches.

15. The interface device of claim 13, wherein said first level of switches comprises two first level switches, said second level of switches comprises two second level switch, and said third level of switches comprises four third level switches.

16. The interface device of claim 12, wherein said at least two levels of switches comprise:
a first level of switches, each first level switch having a first input coupled to one of said two network analyzer ports, and having a plurality of first outputs;
a plurality of terminators; and
a second level of switches, each second level switch having a plurality of second inputs and a second output coupled to one of the more than two test ports, wherein at least one of said second inputs is coupled to said first level of switches, and at least one of said second inputs is coupled to one of said terminators.

17. The interface device of claim 12, further comprising:
switch control and status circuits coupled to said at least two levels of switches; and
a computer interface coupled to said switch control and status circuits.

18. The interface device of claim 13, said third level of switches comprising N group of switches, each group having M output ports, wherein:
said first level of switches comprises two 1:(N−1) switches;
said second level of switches comprises (N−2) number of 2:1 switches; and
said third level of switches comprises N number of 1:M switches.

19. The interface device of claim 16, said second level of switches comprising N output ports, wherein:
said the first level of switches comprises two 1:(N−1) switches; and
said second level of switches comprises:
(N−2) number of 3:1 switches;
two 2:1 switches; and
N terminators.

* * * * *